(12) United States Patent
Andreas

(10) Patent No.: US 6,936,534 B2
(45) Date of Patent: Aug. 30, 2005

(54) METHOD FOR THE POST-ETCH CLEANING OF MULTI-LEVEL DAMASCENE STRUCTURES HAVING UNDERLYING COPPER METALLIZATION

(75) Inventor: Michael T. Andreas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/665,238

(22) Filed: Sep. 17, 2003

(65) Prior Publication Data
US 2005/0059232 A1 Mar. 17, 2005

(51) Int. Cl.[7] ................... H01L 21/4763; H01L 21/302
(52) U.S. Cl. ............... 438/626; 438/632; 438/691; 438/693; 438/725
(58) Field of Search .................... 438/622–632, 438/691–697, 725

(56) References Cited

U.S. PATENT DOCUMENTS

| | | | | |
|---|---|---|---|---|
| 3,960,741 A | * | 6/1976 | Gabrail ...................... 252/79.3 |
| 4,787,997 A | * | 11/1988 | Saito et al. ................ 252/79.4 |
| 4,885,056 A | * | 12/1989 | Hall et al. .................. 438/691 |
| 4,905,072 A | * | 2/1990 | Komatsu et al. .............. 257/64 |
| 5,420,069 A | | 5/1995 | Joshi et al. |
| 5,462,892 A | | 10/1995 | Gabriel |
| 6,083,840 A | * | 7/2000 | Mravic et al. ............... 438/693 |
| 6,106,689 A | * | 8/2000 | Matsuyama ................ 205/333 |
| 6,125,861 A | | 10/2000 | Gupta et al. |
| 6,153,043 A | * | 11/2000 | Edelstein et al. ...... 156/345.12 |
| 6,153,530 A | | 11/2000 | Ye et al. |
| 6,194,366 B1 | | 2/2001 | Naghshineh et al. |
| 6,251,787 B1 | | 6/2001 | Edelstein et al. |
| 6,358,360 B2 | * | 3/2002 | Takahashi ............ 257/E21.304 |
| 6,376,345 B1 | * | 4/2002 | Ohashi et al. .............. 438/542 |
| 6,465,358 B1 | | 10/2002 | Nashner et al. |
| 6,475,298 B1 | | 11/2002 | O'Donnell et al. |
| 6,509,273 B1 | | 1/2003 | Imai et al. |
| 6,528,409 B1 | * | 3/2003 | Lopatin et al. ............. 438/618 |
| 6,531,400 B2 | | 3/2003 | Ohashi et al. |
| 6,596,638 B1 | * | 7/2003 | Kondo et al. ............... 438/690 |
| 6,605,874 B2 | * | 8/2003 | Leu et al. ................... 257/758 |
| 6,664,611 B2 | * | 12/2003 | Chen et al. ................. 257/639 |
| 6,696,358 B2 | * | 2/2004 | Mukherjee et al. ......... 438/622 |

* cited by examiner

Primary Examiner—Michael Lebentritt
(74) Attorney, Agent, or Firm—TraskBritt

(57) ABSTRACT

A method for the post-etch cleaning of multi-level, damascene structures which minimizes, or substantially prevents, localized corrosion of underlying copper metallization comprises subjecting an intermediate structure in the fabrication of a multi-level, damascene structure, which structure includes an underlying copper metallization layer and an opening etched therein which exposes at least a portion of the underlying copper metallization layer, to an aqueous or acidic wash solution, in an environment substantially shielded from ambient light, to substantially remove any post-etch residues which may be present on the structure. In one embodiment, the aqueous or acidic wash solution has a nonzero static etch rate when applied to both the copper and conventional dielectric materials, e.g., silicon dioxide.

8 Claims, 4 Drawing Sheets

METHOD FOR THE POST-ETCH CLEANING OF MULTI-LEVEL DAMASCENE STRUCTURES HAVING UNDERLYING COPPER METALLIZATION

BACKGROUND OF THE INVENTION

1. Field of the Invention

The present invention relates generally to semiconductor device fabrication. More particularly, the present invention relates to a post-etch cleaning method for multi-level, damascene structures which minimizes, or substantially prevents, localized corrosion of underlying copper metallization.

2. State of the Art

Integration of ever increasing numbers of active elements on high density integrated circuits (ICs) has necessitated that such ICs feature multiple layers of metal interconnects. In the multi-level metallization architecture used in today's semiconductor devices, aluminum metallization is generally used, as it offers a number of advantages with regard to, for instance, ease of fabrication. However, using state of the art 0.18 µm technology, opening dimensions of 0.25 µm are being reached and interconnects are becoming a limiting factor in terms of the circuit speed of such high performance ICs. This is due, in part, to the resistivity of the interconnects.

One solution for lowering the resistance of interconnects which has been explored in the industry is to change the interconnect metallization from aluminum to copper. Copper has better conductivity ($\rho=1.7$ $\Omega\cdot$cm) than aluminum ($\rho=2.7$ $\Omega\cdot$cm) and has good resistance to electromigration. However, the use of copper for interconnect metallization presents a number of problems. For instance, in conventional aluminum metallization processes, a subtractive plasma etch process is generally utilized to form the metal interconnects. The plasma etch process typically comprises depositing an aluminum layer on a desired substrate, applying a patterned hard mask or photoresist over the aluminum layer, pattern etching the aluminum layer using wet or dry etch techniques, and depositing a dielectric material over the surface of the patterned aluminum layer to provide isolation of the conductive lines and contacts which comprise the IC.

Due to the chemical and physical properties thereof, subtractive plasma etching of copper is more difficult than subtractive plasma etching of aluminum. More particularly, although copper, like aluminum, reacts at low temperatures with the chlorine typically present in plasma etch gases, the product of the reaction is not as volatile as the reaction product with aluminum. This causes copper to corrode, rather than etch, when subjected to conditions similar to those used to etch aluminum. As such, the conventional substractive plasma etch technique used to form aluminum metallization is not adequate for forming copper metallization.

One processing solution which has emerged in the semiconductor industry to introduce copper metallization is a damascene process in which a desired metallization pattern is etched into a dielectric layer, backfilled with a desired metal and subsequently planarized using, for instance, an abrasive planarization technique such as chemical mechanical planarization (CMP). Single damascene processes are used to form only wiring lines or via interconnects in a single dielectric layer. Dual damascene processes, however, may be used to incorporate both inlaid metal lines and via interconnects in a single dielectric layer. Dual damascene processes are generally utilized as, in addition to permitting the effective introduction of copper metallization, the processes provide potentially significant reductions in processing cost.

The dual damascene technique relies upon electroplating metal into preformed vias and trenches, followed by planarizing to remove excess metal from the wafer surface. While either the trench or the via may be etched first in the formation of dual damascene structures, most semiconductor manufacturers have chosen to adopt the via-first approach. The major drawback of the trench-first approach is that after the trench has been etched, the photoresist that is applied for the via etch will completely fill the trench creating local regions of extra thick resist in the areas where the vias are to be patterned. Forming the very fine via structures in such thick resist is extremely difficult and, as a result, the trench-first approach to dual damascene formation has been largely abandoned.

Referring to FIGS. 1A through 1K, an exemplary, via-first, dual damascene process sequence is illustrated. It will be understood by those of ordinary skill in the art that the methods and structures described herein do not form a complete process for manufacturing multi-level ICs. The remainder of the process is known to those of ordinary skill in the art and, therefore, only the process steps and structures necessary to understand the conventional, via-first, dual damascene process sequence are described herein.

Referring to FIG. 1A, a cross-sectional view of a first intermediate structure 10 in the fabrication of a multi-level, dual damascene structure 34 (see, FIG. 1K) comprising an underlying copper metallization layer 12 (e.g., a copper line or grounded copper contact) is illustrated. The first intermediate structure 10 includes a barrier layer 14 which resides on the underlying copper metallization layer 12. It will be understood by those of ordinary skill in the art that the figures presented in conjunction with this description are not meant to be actual cross-sectional views of any particular portion of an actual multi-level, dual damascene structure, but are merely idealized representations which are employed to more clearly and fully depict the conventional via-first, dual damascene process sequence than would otherwise be possible. Elements common between the figures maintain the same numeric designation.

Over the barrier layer 14, a first interlevel dielectric layer 16, e.g. a silicon dioxide layer, may be formed. In multi-level metallization, the damascene process sequence may be used to incorporate copper metallization at all levels in which such metallization is desired. In those cases in which an upper level of metallization is to be incorporated, i.e., where there is already an underlying copper metallization layer 12 as illustrated in FIGS. 1A–1K, the barrier layer 14 is necessary because the copper in the underlying metallization layer 12 can easily diffuse into the first interlevel dielectric layer 16 and exhibits poor adhesion thereto. The barrier layer 14 may also be used as an etch stop when the first interlevel dielectric layer 16 is etched, as more filly described below. In this regard, the etch rate of the material of the barrier layer 14 should be significantly lower than that of the material of the first interlevel dielectric layer 16 in order to ensure adequate etch selectivity. The difference in etch rate between silicon dioxide (an exemplary material for the first interlevel dielectric layer 16) and silicon nitride (an exemplary material for the barrier layer 14) adequately provides such selectivity.

An embedded etch stop layer 18 formed of, for instance, silicon nitride, may be disposed over the first interlevel dielectric layer 16, and a second interlevel dielectric layer 20 may be formed over the embedded etch stop layer 18, as shown.

Referring to FIG. 1B, a via photoresist layer 22 may be formed over the second interlevel dielectric layer 20 and photolithographically patterned. Subsequently, as shown in FIG. 1C, an etch, typically an anisotropic dry etch, may be performed extending the via pattern through the second interlevel dielectric layer 20, the embedded etch stop layer 18 and the first interlevel dielectric layer 16, stopping at the barrier layer 14. This etch forms a via 23. It will be understood by those of ordinary skill in the art that multiple etch steps may be required to etch through each of the desired layers. If the via etch is not stopped at the barrier layer 14, copper from the underlying copper metallization layer 12 will sputter into the unprotected via 23. The copper will then quickly diffuse into the interlevel dielectric layers 16 and 20, which may lead to device failure.

Next, the via photoresist layer 22 may be removed (e.g., using a plasma strip technique), as shown in FIG. 1D. The via 23 may subsequently be cleaned to remove any residual photoresist material and any dielectric etch material residues therefrom. In addition to preventing diffusion into, and enhancing adhesion to, the first interlevel dielectric layer 16, the barrier layer 14 also permits the via etch residues to be isolated from the underlying copper metallization layer 12, allowing the via 23 to be cleaned at this stage according to conventional techniques.

Next, as shown in FIG. 1E, a trench photoresist layer 24 may be formed over the second interlevel dielectric layer 20 and photolithographically patterned. Some of the trench photoresist layer 24 will be deposited in the bottom of the via 23 and will prevent the lower portion of the via 23 from being overetched during the trench etch process. Those of ordinary skill in the art will understand that an organic antireflective coating (ARC) or the like (not shown) may also be used to protect the via 23 and the portion of the barrier layer 14 underlying the via 23, if desired.

Subsequently, as shown in FIG. 1F, an etch, typically an anisotropic dry etch, may be performed to extend the trench pattern through the second interlevel dielectric layer 20, the etch stopping at the embedded etch stop layer 18. This etch forms a trench 25. It will be understood by those of ordinary skill in the art that, if desired, the intermediate structure 10 may have only a single interlevel dielectric layer and be void of the embedded etch stop layer 18 altogether. However, if an embedded etch stop layer 18 is not used, the etch system must be capable of a very uniform etch to ensure all trenches 25 are of the same depth across the wafer, and from wafer to wafer. This could be difficult since there is no real endpoint indicator and the depth of the trench 25 can only be determined by the length of time of the etch. The trench photoresist layer 24 may subsequently be stripped (e.g., using a plasma strip technique), as shown in FIG. 1G.

In order to adequately connect the upper metallization level to the underlying copper metallization layer 12, the barrier layer 14 must be "punched-through" at the bottom of the via 23, once the via 23 and the trench 25 have been etched, as previously described. This step is shown in FIG. 1H and is typically accomplished using a separate etch selective for the material of the barrier layer 14.

Once the barrier layer 14 has been punched-through beneath the via 23, the dual damascene structure 34 may be completed by forming a thin diffusion barrier 26 lining the bottom and sidewalls 23a and 25a of the via 23 and the trench 25, respectively, optionally forming a copper "seed" layer 28 over the diffusion barrier 26, depositing bulk copper 30 over the structure such that the trench 25 and via 23 are filled therewith (see, FIG. 1I) and planarizing the bulk copper 30 to stop on the surface of the second interlevel dielectric layer 20 using, e.g., CMP (see, FIG. 1J). The dual damascene structure 34 may subsequently be completed by deposition of a thin cap layer 32 (e.g., a silicon nitride cap layer) over the planarized bulk copper 30 and the second interlevel dielectric layer 20.

When the barrier layer 14 is etched (see, FIG. 1H), back-sputtering of copper onto the sidewalls 23a and 25a of the via 23 and the trench 25, respectively, or elsewhere on the structure, may occur. Additionally, post-etch residues from etching the dielectric layers 16 and 20 and the embedded etch stop layer 18 may remain as well. It is desirable to remove this contamination prior to completion of the metallization, i.e., prior to deposition of the diffusion barrier 26. If not removed, the residues will remain trapped under the diffusion barrier 26. Residues, particularly copper residues, located on the wrong side of the diffusion barrier 26 may contribute to or cause device failure if, for instance, they diffuse into the dielectric layers 16 and 20.

Conventional post-etch cleaning of metallization structures generally involves the use of an aqueous or acidic wash solution using, e.g., a dilute hydrofluoric acid (F) solution. However, the use of copper metallization creates problems with such aqueous wash techniques as the exposed copper at the bottom of the etched vias is more susceptible to localized corrosion than previously used metals, such as aluminum. Corrosion, which may be facilitated by aqueous and/or acidic wash techniques, can lead to pitting and opens in the metallization, which can adversely affect the electrical properties of the semiconductor device. As a result, many semiconductor device manufacturers use a solvent or nonaqueous wash to remove post-etch residues prior to completion of dual damascene structures. Solvent/nonaqueous washes, however, produce waste which necessitates relatively expensive disposal techniques.

Corrosion of copper (i.e., the electrochemical dissolution thereof) in semiconductor devices has been found to be a photo-induced phenomenon caused by exposure of the PN junctions on the wafer to light. This photovoltaic effect is known to those of ordinary skill in the art and has been described in some detail in U.S. Pat. No. 6,251,787 to Edelstein et al. (hereinafter the "Edelstein et al. patent"), which is hereby incorporated by reference herein as if set forth in its entirety. In the Edelstein et al. patent, corrosion of a copper layer subsequent to chemical mechanical polishing thereof is addressed.

Accordingly, the inventor hereof has recognized that a post-etch cleaning method for multi-level, damascene structures which minimizes, or substantially prevents, localized corrosion of underlying copper metallization, yet permits the use of aqueous or acidic wash solutions would be advantageous.

BRIEF SUMMARY OF THE INVENTION

The present invention, in one exemplary embodiment, includes a method for post-etch cleaning of multi-level damascene structures, which method minimizes, or substantially prevents, localized corrosion of underlying copper metallization. The method comprises subjecting an intermediate structure in the fabrication of a multi-level damascene structure, which structure includes an underlying copper metallization layer and an etched opening (e.g., a via) exposing at least a portion of the underlying copper metallization layer, to an aqueous or acidic wash solution, in an environment substantially shielded from ambient light, to substantially remove any post-etch residues which may be present on the sidewalls of the opening, or elsewhere on the structure. In one embodiment, the aqueous or acidic wash solution has a nonzero static etch rate when applied to both the copper and conventional dielectric materials, e.g., silicon dioxide. An exemplary wash solution comprises about 7.0% by weight acetic acid, about 0.4% by weight nitric acid and about 0.15% by weight hydrofluoric acid. If this exemplary wash solution is utilized, the intermediate structure may be exposed to the solution for a period of time ranging from about thirty seconds to about two minutes, depending upon the amount of residue to be removed therefrom.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

The present invention is directed to a method for the post-etch cleaning of multi-level damascene structures having underlying copper metallization. The method provides a way in which localized, photo-induced corrosion of copper metallization underlying etched openings in damascene structures may be minimized, or substantially prevented, while permitting the use of aqueous or acidic wash solutions to clean the structures. The particular embodiments described herein are intended in all respects to be illustrative rather than restrictive. Other and further embodiments will become apparent to those of ordinary skill in the art to which the invention pertains without departing from its scope.

The method of the present invention comprises subjecting an intermediate structure in the formation of a multi-level damascene structure, which intermediate structure includes an etched opening therein through which at least a portion of an underlying copper metallization layer is exposed, to an aqueous or acidic wash solution, in an environment substantially shielded from ambient light, to remove any residues which may be present on the sidewalls of the etched opening, or elsewhere on the intermediate structure. One example of such an intermediate structure is the intermediate structure 36 shown in FIG. 1H.

Figure 1A:
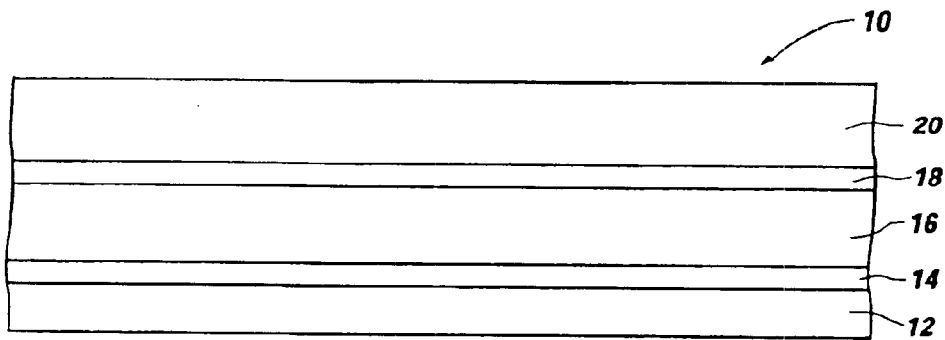
FIGS. 1A through 1K are side cross-sectional views illustrating a conventional method for forming a multi-level, dual damascene structure with which the post-etch cleaning method of the present invention may be utilized.
Figure 1B:
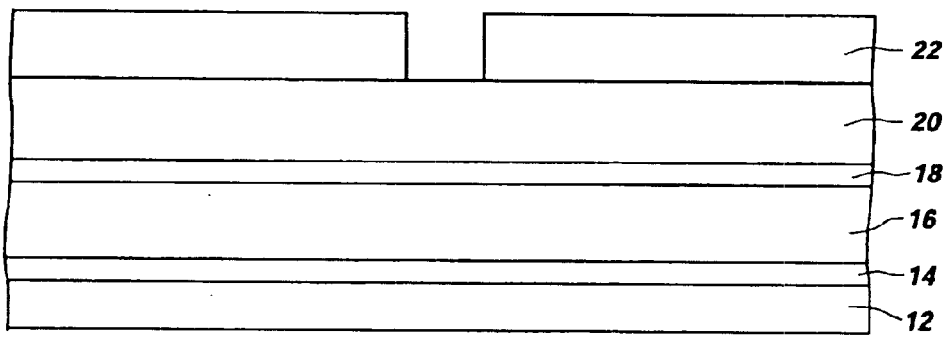
Figure 1C:
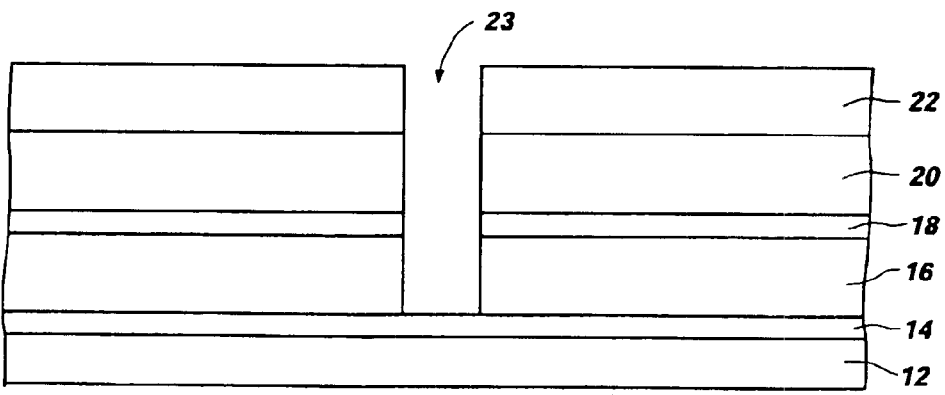
Figure 1D:
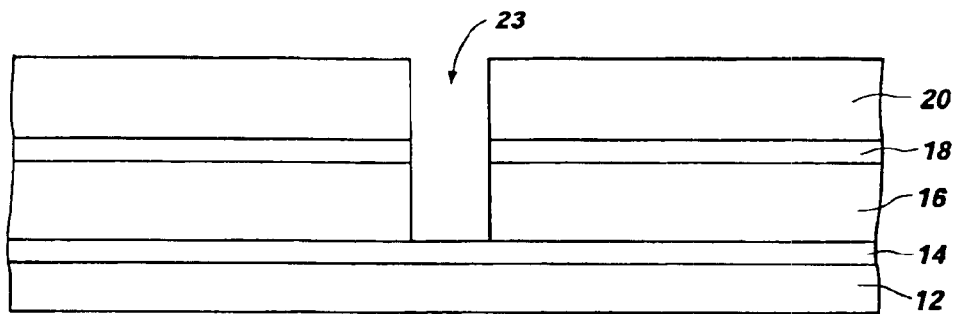
Figure 1E:
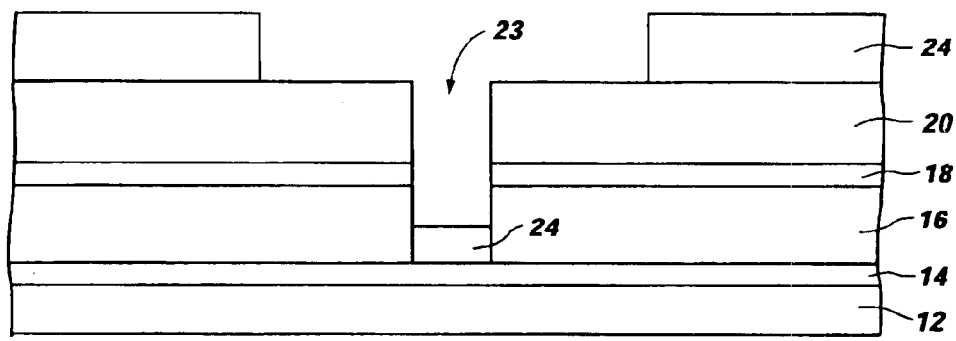
Figure 1F:
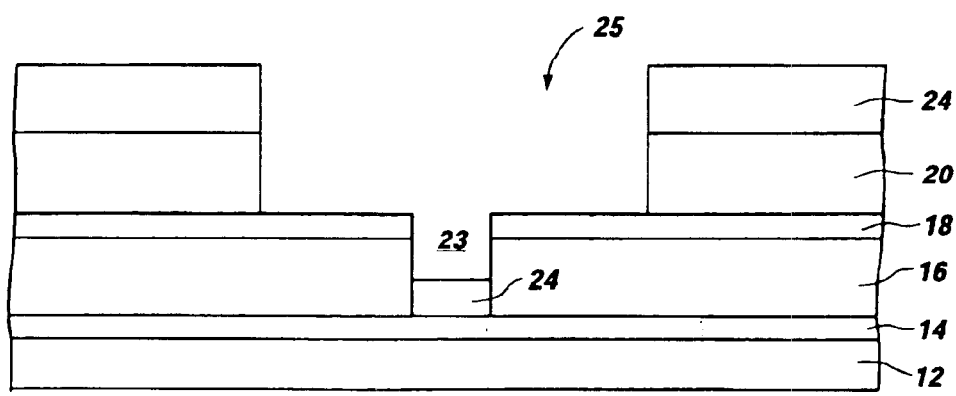
Figure 1G:
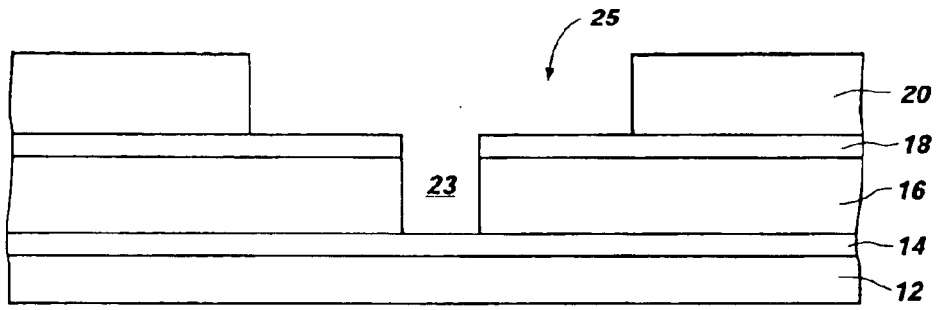
Figure 1H:
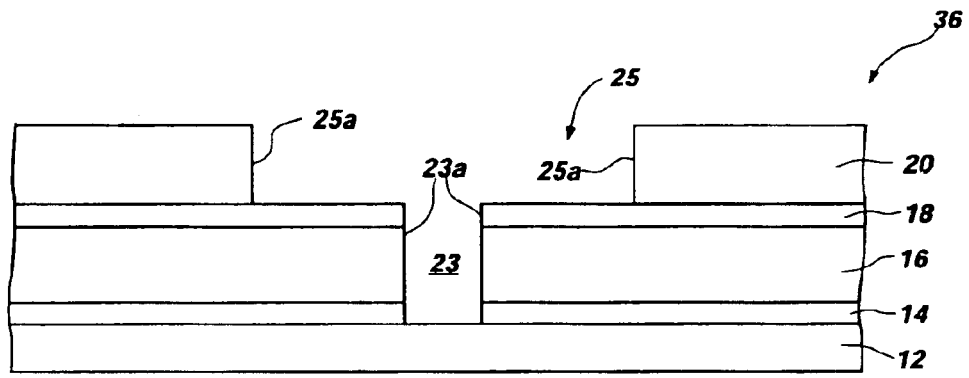
Figure 1I:
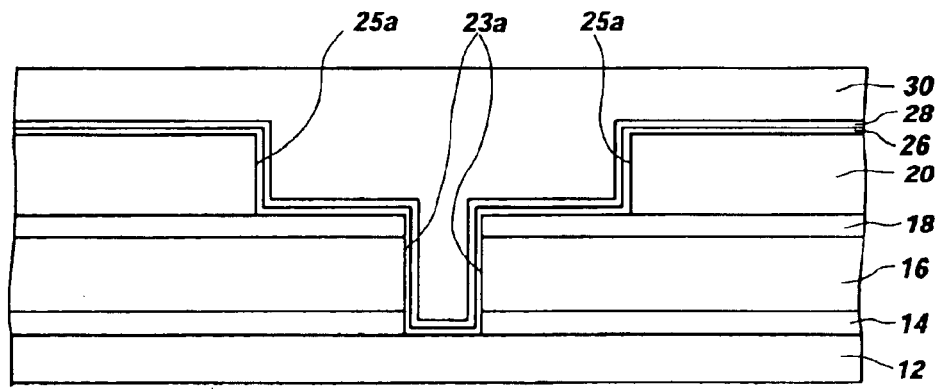
Figure 1J:
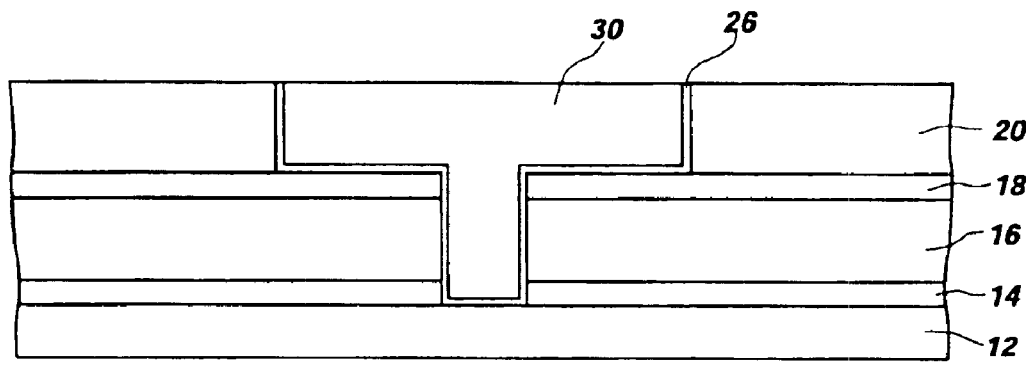
Figure 1K:
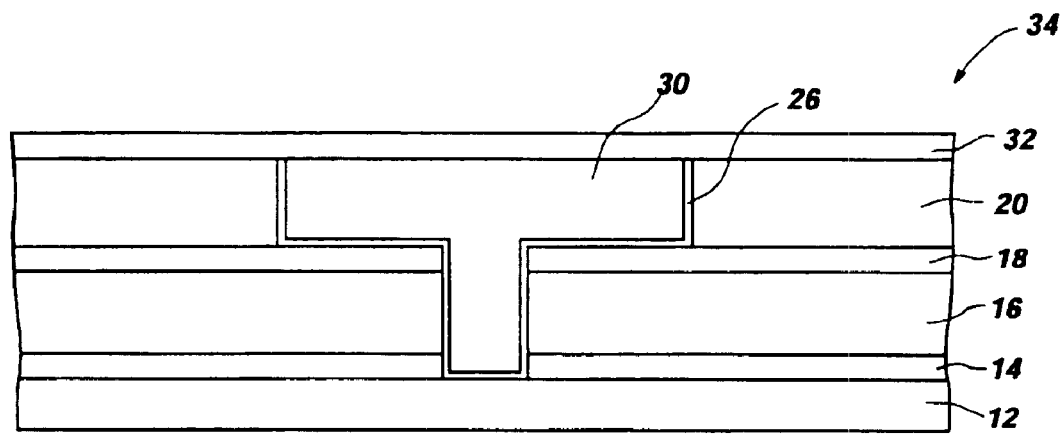

As previously described, the intermediate structure 36 shown in FIG. 1H is at a stage of multi-level, dual damascene structure processing wherein the barrier layer 14, which had been separating the underlying copper metallization layer 12 from the first interlevel dielectric layer 16 and the unprotected via 23, has been punched-through, exposing at least a portion of the underlying copper metallization layer 12. If the intermediate structure 36 were to be cleaned utilizing conventional aqueous wash techniques, while subjecting the exposed portion of the copper metallization layer 12 to ambient light, dissolution of the copper comprising the copper metallization layer 12 would be likely to occur. This is because not only does the ambient light cause photo-induced corrosion, as previously described, it has been observed that use of aqueous or acidic wash solutions (i.e., solutions having a high ionic content) in the presence of ambient light actually facilitates such corrosion beyond that which may be observed by exposure to ambient light alone. If, however, the intermediate structure 36 is cleaned utilizing the post-etch cleaning method of the present invention, localized corrosion of the exposed portion of the underlying copper metallization layer 12 may be substantially prevented.

It is currently preferred that an aqueous/acidic wash solution comprising about 7.0% by weight acetic acid, about 0.4% by weight nitric acid and about 0.15% by weight hydrofluoric acid be utilized, in combination with reduced ambient light conditions, to remove any copper residues, interlevel dielectric material residues, or other residues that are likely to be present on the sidewalls 23a and 25a respectively, of the via 23 or trench 25, or elsewhere on the intermediate structure 36. This acetic/nitric/hydrofluoric acid solution has a static etch rate of about 15 Å/minute for both metals, including copper, and conventional dielectric materials, including silicon dioxide. Thus, this solution permits a uniform etch of substantially all of the residues that are likely to be present on the sidewalls 23a and 25a, respectively, of the via 23 or trench 25, or elsewhere on the intermediate structure 36. The intermediate structure 36 may be exposed to the aqueous wash solution, in an environment substantially shielded from ambient light, for a period of time ranging from about thirty seconds to about two minutes, the duration depending upon the amount of residue to be removed from the intermediate structure 36.

The method of the present invention may also be utilized with other aqueous or acidic wash solutions known to those of ordinary skill in the art including, but not limited to, diluted hydrofluoric acid (HP). It is currently preferred that the aqueous or acidic wash solution utilized have a nonzero static etch rate for both copper and conventional dielectric materials. The duration of exposure to the solution, in reduced ambient light conditions, will be dependent upon the static etch rate and the amount of residue present on the post-etch structure.

In practice, the structure to be cleaned, which structure typically would include a plurality of vias and trenches etched therein, would be placed in a reduced ambient light chamber which preferably completely shields and isolates the structure from all ambient light and the aqueous/acidic wash solution would be applied to the etched surfaces thereof for a period of time (in the case of the acetic/nitric/ hydrofluoric acid wash solution discussed above) ranging from about thirty seconds to about two minutes. Again, the duration of exposure to the wash solution would depend upon the amount of residue to be removed from the structure. The structure would subsequently be removed from the chamber and a diffusion barrier 26 formed thereover, as previously discussed, followed by an optional seed layer 28 and a bulk copper layer 30. It is currently preferred that the structure remain in reduced ambient light conditions until the diffusion barrier 26 is formed over the exposed portion of the underlying copper metallization layer 12 to further minimize photo-induced corrosion thereof.

The method of the present invention is not limited to copper upper-level metallization but may be utilized for upper-level metallization formed of any metal known in the art. That is, the method hereof provides a way in which underlying copper metallization (e.g., grounded copper contacts) may be substantially protected from localized corrosion. However, if, for example, an aluminum or tungsten metallization layer is desired overlaying a copper metallization layer, the method of the present invention may still be utilized to minimize or substantially prevent corrosion of the underlying copper metallization, provided the aluminum or tungsten metallization layer is formed using a damascene process. It will be further understood that while FIGS. 1A through 1K illustrate formation of a dual damascene structure formed over an underlying copper metallization layer, the method of the present invention may also be utilized if a single damascene structure is formed. In fact, in any situation wherein copper is exposed through an opening etched in a material layer formed thereover, the process of the present invention may be utilized.

The present invention has been described in relation to particular embodiments that are intended in all respects to be illustrative rather than restrictive. It is to be understood that the invention defined by the appended claims is not to be limited by particular details set forth in the above description and that alternative embodiments will become apparent to those of ordinary skill in the art to which the present invention pertains without departing from the spirit and scope thereof.

What is claimed is:

1. A method for post-etch cleaning of a damascene structure having a barrier layer disposed over at least a portion of an underlying copper metallization layer and a dielectric layer disposed over at least a portion of the barrier layer, comprising:

etching at least one opening through a dielectric layer and a barrier layer to expose at least a portion of an underlying copper metallization layer and form an etched structure; and subjecting the etched structure to an aqueous solution in an environment wherein the etched structure is substantially shielded from ambient light, wherein the aqueous solution comprises about 7.0% by weight acetic acid, about 0.4% by weight nitric acid, and about 0.15% by weight hydrofluoric acid.

2. The method of claim 1, wherein subjecting the etched structure to an aqueous solution comprises subjecting the etched structure to the aqueous solution for a period of time ranging from about 30 seconds to about 2 minutes.

3. A method for forming a damascene structure having an underlying copper metallization layer, comprising:

forming a barrier layer over at least a portion of an underlying copper metallization layer;

forming a dielectric layer over at least a portion of the barrier layer;

etching at least one opening through the dielectric layer and the barrier layer to expose at least a portion of the underlying copper metallization layer and form an etched structure; and subjecting the etched structure to an aqueous solution in an environment wherein the etched structure is substantially shielded from ambient light, wherein the aqueous solution comprises about 7.0% by weight acetic acid, about 0.4% by weight nitric acid, and about 0.15% by weight hydrofluoric acid.

4. The method of claim 3, wherein subjecting the etched structure to an aqueous solution comprises subjecting the etched structure to the aqueous solution for a period of time ranging from about 30 seconds to about 2 minutes.

5. The method of claim 3, further comprising forming a diffusion barrier over the etched structure subsequent to subjecting the etched structure to the aqueous solution while maintaining the etched structure in the environment wherein the etched structure is substantially shielded from ambient light.

6. The method of claim 5, further comprising:

forming a bulk copper layer over the diffusion barrier such that the at least one opening is filled therewith; and planarizing the bulk copper layer to a surface of the dielectric layer.

7. A method for substantially preventing corrosion of copper metallization exposed through an opening etched in an overlying material layer of a damascene structure during an aqueous post-etch cleaning, comprising:

subjecting a damascene structure to an aqueous solution while maintaining the damascene structure in an environment wherein the damascene structure is substantially shielded from ambient light, wherein the aqueous solution comprises about 7.0% by weight acetic acid, about 0.4% by weight nitric acid, and about 0.15% by weight hydrofluoric acid; and forming a diffusion barrier over the damascene structure and walls of the opening subsequent to subjecting the damascene structure to the aqueous solution while maintaining the damascene structure in the environment wherein the damascene structure is substantially shielded from ambient light.

8. The method of claim 7, wherein subjecting the damascene structure to an aqueous solution comprises subjecting the damascene structure to the aqueous solution for a period of time ranging from about 30 seconds to about 2 minutes.

* * * * *

UNITED STATES PATENT AND TRADEMARK OFFICE
CERTIFICATE OF CORRECTION

| | | |
|---|---|---|
| PATENT NO. | : 6,936,534 B2 | Page 1 of 1 |
| APPLICATION NO. | : 10/665238 | |
| DATED | : August 30, 2005 | |
| INVENTOR(S) | : Michael T. Andreas | |

It is certified that error appears in the above-identified patent and that said Letters Patent is hereby corrected as shown below:

COLUMN 2, LINE 54, change "filly" to --fully--

Signed and Sealed this

Thirtieth Day of December, 2008

JON W. DUDAS
*Director of the United States Patent and Trademark Office*